United States Patent
Gambino et al.

(10) Patent No.: US 7,169,698 B2
(45) Date of Patent: Jan. 30, 2007

(54) SACRIFICIAL INORGANIC POLYMER INTERMETAL DIELECTRIC DAMASCENE WIRE AND VIA LINER

(75) Inventors: Jeffrey P. Gambino, Westford, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/707,811

(22) Filed: Jan. 14, 2004

(65) Prior Publication Data

US 2005/0153505 A1    Jul. 14, 2005

(51) Int. Cl.
*H01L 21/4763* (2006.01)
*H01L 21/44* (2006.01)
*H01L 21/311* (2006.01)

(52) U.S. Cl. .................. 438/622; 438/623; 438/624; 438/625; 438/629; 438/637; 438/638; 438/639; 438/640; 438/666; 438/672; 438/700; 257/E21.575

(58) Field of Classification Search ........ 438/622–625, 438/637–640, 629, 666, 668, 672, 700
See application file for complete search history.

(56) References Cited

U.S. PATENT DOCUMENTS

| | | | |
|---|---|---|---|
| 6,043,146 A | 3/2000 | Watanabe et al. | |
| 6,066,557 A | 5/2000 | Lukanc et al. | |
| 6,100,183 A | 8/2000 | Lu et al. | |
| 6,211,069 B1 * | 4/2001 | Hu et al. | 438/637 |
| 6,284,657 B1 * | 9/2001 | Chooi et al. | 438/687 |
| 6,287,955 B1 | 9/2001 | Wang et al. | |
| 6,291,333 B1 * | 9/2001 | Lou | 438/618 |
| 6,362,093 B1 | 3/2002 | Jang et al. | |
| 6,365,529 B1 | 4/2002 | Hussein et al. | |
| 6,380,078 B1 | 4/2002 | Liu et al. | |
| 6,380,084 B1 | 4/2002 | Lim et al. | |
| 6,410,426 B1 | 6/2002 | Xing et al. | |
| 6,429,115 B1 | 8/2002 | Tsai et al. | |
| 6,440,840 B1 | 8/2002 | Chen | |
| 6,444,557 B1 | 9/2002 | Biolsi et al. | |
| 6,492,270 B1 * | 12/2002 | Lou | 438/687 |
| 6,815,329 B2 * | 11/2004 | Babich et al. | 438/619 |
| 6,893,956 B2 * | 5/2005 | Ruelke et al. | 438/627 |
| 2005/0196959 A1 * | 9/2005 | Ueno | 438/643 |

\* cited by examiner

*Primary Examiner*—Michael Lebentritt
*Assistant Examiner*—Mohsen Ahmadi
(74) *Attorney, Agent, or Firm*—Scully, Scott, Murphy & Presser, P.C.; William D. Sabo, Esq.

(57) ABSTRACT

The present invention provides a method of forming a rigid interconnect structure, and the device therefrom, including the steps of providing a lower metal wiring layer having first metal lines positioned within a lower low-k dielectric; depositing an upper low-k dielectric atop the lower metal wiring layer; etching at least one portion of the upper low-k dielectric to provide at least one via to the first metal lines; forming rigid dielectric sidewall spacers in at least one via of the upper low-k dielectric; and forming second metal lines in at least one portion of the upper low-k dielectric. The rigid dielectric sidewall spacers may comprise of SiCH, SiC, SiNH, SiN, or $SiO_2$. Alternatively, the via region of the interconnect structure may be strengthened with a mechanically rigid dielectric comprising $SiO_2$, SiCOH, or doped silicate glass.

8 Claims, 12 Drawing Sheets

SACRIFICIAL INORGANIC POLYMER INTERMETAL DIELECTRIC DAMASCENE WIRE AND VIA LINER

BACKGROUND OF INVENTION

1. Field of the Invention

The present invention relates generally to the manufacture of semiconductor devices, and more particularly to a method of forming an interconnect via through a low dielectric constant (k) dielectric material.

2. Background of the Invention

In the production of microelectronic devices, integrated circuits utilize multilevel wiring structures for interconnecting regions within devices and for interconnecting one or more devices within integrated circuits. Conventionally, forming interconnect structures begins with forming a lower level of wiring followed by the deposition of an interlevel dielectric layer and then a second level of wiring, where the first and second wiring levels may be connected by one or more metal filled vias.

Conventional interconnect structures employ one or more metal layers. Each metal layer is typically made from aluminum alloys or tungsten. Interlevel and intralevel dielectrics (ILDs), such as silicon dioxide ($SiO_2$), are used to electrically isolate active elements and different interconnect signal paths from each other. The electrical connections between different interconnect levels are made through vias that are formed in the ILD layers. Typically, the vias are filled with a metal, such as tungsten.

Recently, there has been great interest to replace $SiO_2$ with low-dielectric constant ("low-k") materials as the intralevel and/or interlevel dielectrics in interconnect structures. Examples of low-k dielectrics include polymer-based low-k dielectric materials, which may or may not comprise a polymer, or carbon-doped oxide having a low dielectric constant. An example of a low-k b-staged polymer is SiLK™ (trademark of The Dow Chemical Company) having a composition including 95% carbon. An example of a low-dielectric carbon doped oxide is SiCOH. It is desirable to employ low-k materials as insulators in IC interconnect because these low-k materials reduce the interconnect capacitance. Accordingly, these low-k materials increase the signal propagation speed while reducing cross-talk noise and power dissipation in the interconnect.

The main problem with low-k materials is that they lack mechanical rigidity and easily crack when subjected to thermal and mechanical stresses. Conventionally, in via processing the interlevel dielectric layer is etched to provide an opening in which a metal interconnect is later formed to provide a means of communication between metal layers. Despite the ability of low-k materials to reduce the interconnect capacitance, forming via interconnects through low-k interlayer dielectrics having low mechanical strength produces a number of disadvantageous results. For example, if the dielectric is bent or is mechanically stressed, the interconnect metal may break within the via. Additionally, differences between the thermal coefficient of expansion of the metal interconnect and low-k interlevel and/or intralevel dielectrics produce further stresses that contribute to via breakage and chip failure.

Attempts to overcome the above disadvantages have resulted in further difficulties. For example, referring to FIG. 1, attempts have been made to use a thick refractory metal liner 22 to reinforce the low-k dielectric interlevel dielectric 35 and interconnect via 24. Via interconnects 24 are typically formed from a low resistance interconnect metal, such as copper. The high resistivity refractory metal liner 22 has a resistance much greater than the low resistance copper used in the via interconnect 24 and wiring 25, 26. Therefore, introducing refractory metal within the via opening 24 disadvantageously increases the resistance of the interconnect structure 10.

Additionally, refractory metals, such as Ta, are difficult to deposit using chemical vapor deposition. Therefore, the refractory metal liner 22 is typically deposited using sputter deposition. Sputter deposition fails to sufficiently deposit metal along the via 24 sidewalls of the low-k ILD dielectric 35. In order to deposit the required thickness of metal along the sidewalls of the via 24, a very thick layer of refractory metal 22 must be sputter deposited atop of the lateral surfaces. By increasing the thickness of the refractory metal liner 22, greater amounts of high resistance refractory metal is introduced into the via opening. Additionally, introducing high resistance refractory metal within the via opening 24 reduces the diameter of the low resistance component of the via interconnect 24 further increasing it's resistance.

In view of the above, a low resistivity via interconnect is needed having thin mechanically rigid dielectric layers.

SUMMARY OF INVENTION

An objective of the present invention is to provide a method for producing a low resistivity interconnect structure comprising mechanically rigid low-k interlevel and/or intralevel dielectric layers. A further object of the present invention is to provide a rigid interconnect structure comprising low-k dielectric materials with improved thermal-mechanical properties. The term "low-k" is used herein to denote a dielectric material having a dielectric constant preferably less than about 3.5. The term "low-resistivity" is used herein to denote a resistivity of 2.0 μΩ-cm or less.

The present invention advantageously provides a method for providing rigid via interconnects through low-k dielectric layers, in which structural rigidity is provided by a set of thin rigid insulating sidewall spacers that are positioned on the sidewalls of the via opening. In broad terms, the inventive method comprises:

providing a lower metal wiring layer having first metal lines positioned within a lower low-k dielectric;

depositing an upper low-k dielectric atop the lower metal wiring layer;

etching at least one portion of the upper low-k dielectric to provide at least one via to the first metal lines;

forming rigid dielectric sidewall spacers in at least one via of the upper low-k intralevel dielectric; and forming second metal lines in at least one portion of the upper low-k dielectric.

More specifically, the rigid dielectric sidewall spacers may be formed by first depositing a conformal rigid dielectric liner within the via and atop the upper low-k dielectric using a conformal deposition process. Thereafter, the horizontal surfaces of the conformal rigid dielectric liner are etched with an anisotropic etching process, where the remaining portion of the rigid dielectric liner positioned on the via sidewalls forms the rigid dielectric spacers. The rigid dielectric spacers may be formed from any rigid insulating material including, but not limited to: SiCH, SiC, SiNH, SiN, or $SiO_2$. The rigid dielectric sidewall spacers typically have a thickness ranging from about 10 nm to about 100 nm. The term "rigid" it is meant to denote that the elastic modulus is greater than 10 GPa, and preferably is greater than 50 GPa.

In broad terms, the above method produces an interconnect structure comprising:

a lower metal wiring level comprising first metal lines positioned within a lower low-k dielectric; and an upper metal wiring level atop the lower metal wiring level, the upper metal wiring level comprising second metal lines positioned within an upper low-k dielectric;

a plurality of vias through a portion of the upper low-k dielectric electrically connecting the lower metal wiring level and the upper metal wiring level, wherein the plurality of vias comprise a set of rigid dielectric sidewall spacers.

More specifically, the rigid dielectric sidewall spacers of the above interconnect structure typically have a thickness ranging from about 10 nm to about 100 nm and may comprise SiCH, SiC, SiCOH, SiNH, SiN, or $SiO_2$.

Another aspect of the present invention is a method of forming an interconnect structure having increased rigidity low-k dielectric layers and improved thermal mechanical strength. Increased rigidity and thermal mechanical strength may be provided by a rigid dielectric layer having a coefficient of thermal expansion (CTE) that substantially matches the via metal. Broadly, the inventive method comprises:

providing a lower metal wiring layer having first metal lines positioned within a lower low-k dielectric;

depositing a mechanically rigid dielectric atop the lower metal wiring layer;

forming at least one via to a portion of the first metal lines through the mechanically rigid dielectric; and forming an upper metal wiring layer having second metal lines positioned within an upper low-k dielectric, the second metal lines are electrically connected to the first metal lines through the vias, wherein the vias comprises a metal having a coefficient of thermal expansion that substantially matches the mechanically rigid dielectric.

More specifically, the mechanically rigid dielectric may comprise $SiO_2$, SiCOH, or F-doped glass and have a thickness that typically ranges from about 100 nm to about 1,000 nm, preferably being 300 nm. The mechanically rigid dielectric may comprise a coefficient of thermal expansion ranging from about 0.1 ppm/° C. to about 5.0 ppm/° C. The coefficient of thermal expansion of the mechanically rigid dielectric may be substantially matched to the coefficient of thermal expansion of the via metal. By reducing the differential in the coefficient of thermal expansion between the via metal and the mechanical rigid dielectric, the thermal mechanical stresses that may be produced at the interface of the via and the mechanical rigid dielectric are reduced.

In broad terms, the above method produces an interconnect structure comprising:

a lower metal wiring level comprising first metal lines positioned within a lower low-k dielectric;

a mechanically rigid dielectric positioned on the lower metal wiring level, the mechanically rigid dielectric comprising a plurality of metal vias, wherein the plurality of metal vias have a coefficient of thermal expansion that substantially matches the mechanically rigid dielectric; and an upper metal wiring level atop the mechanically rigid dielectric, the upper metal wiring level comprising second metal lines positioned within an upper low-k dielectric, wherein the plurality of metal vias electrically connect the lower metal wiring level and the upper metal wiring level.

Specifically, the mechanically rigid dielectric may comprises $SiO_2$, SiCOH, or doped silicate glass.

DETAILED DESCRIPTION

Figure 1:
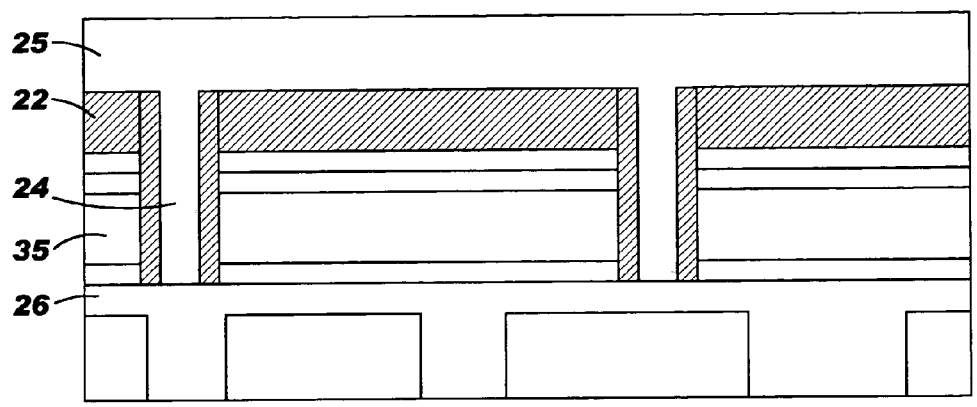
FIG. 1 depicts (through cross section) a prior art via interconnect having a thick and non-uniform TaN liner.

An interconnect structure, and method of forming thereof, will now be discussed in greater detail referring to the drawings accompanying the present invention. It is noted in the accompanying drawings like and corresponding elements are referred to by like reference numbers. Although the drawings show the presence of two wiring layers, the present invention is not limited to low resistance interconnect structures having only two wiring layers. Instead, the present invention works equally well with interconnect structure having a plurality of wiring levels, one over the other, in which a liner material enhances the rigidity of low-k dielectrics.

The present invention provides low resistance via interconnects through rigid low-k interlevel and intralevel dielectric layers. In one embodiment of the present invention, the rigidity of low-k dielectric layers in the interconnect structures is increased by a thin mechanically rigid liner lining the sidewall of a via opening in a low-k dielectric. In prior art methods, a high resistance refractory metal, i.e., TaN, was sputter deposited to protect the low-k dielectric layer via sidewalls during device processing and to strengthen the low-k dielectric regions in which via interconnects are formed. Sputter deposition is problematic, due in part, to the poor sputter rate and non-uniformity of the deposited refractory metal on via sidewalls.

Figure 2:
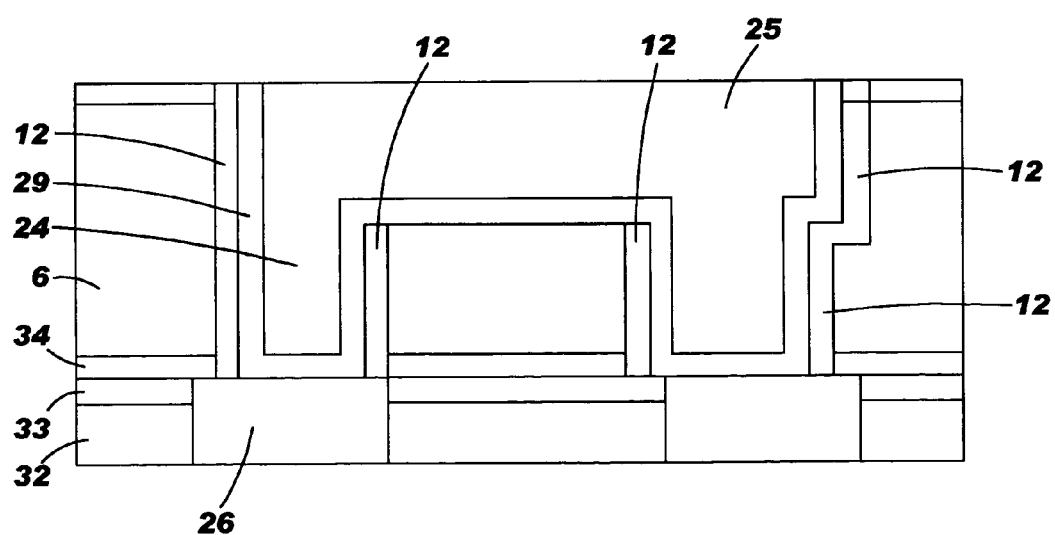
FIG. 2 depicts (through cross section) one embodiment of the interconnect structure of the present invention including rigid insulating sidewall spacers within a via positioned in a low-k dielectric layer.

In one embodiment, the present invention strengthens the low-k dielectric interconnect regions by depositing a rigid dielectric liner 11, preferably comprising SiC, by plasma enhanced chemical vapor deposition on the via 24 sidewalls of the low-k dielectric layer 6 and later processing the rigid dielectric liner 11 into rigid dielectric sidewall spacers 12, on which the via interconnect is formed 24, as depicted in FIG. 2. The rigid dielectric sidewall spacers 12 increase the rigidity of the via interconnect 24 region of the low-k dielectric layer, while maintaining a low interconnect capacitance. Further, the rigid dielectric sidewall spacers 12 are uniformly deposited by chemical vapor deposition methods, therefore overcoming the disadvantages of prior methods utilizing sputter deposition to non-uniformly deposit high resistivity metal support structures.

Referring to FIG. 2, the interconnect structure 10 may comprise first metal lines 26 separated from second metal lines 25 by an upper low-k dielectric layer 6, where electrical contact between the first metal lines 25 and second metal lines 26 is established by at least one via interconnect 24 in the upper low-k dielectric layer 6. The sidewalls of the via interconnect 24 are reinforced by rigid dielectric sidewall spacers 12 having a thickness ranging from about 10 nm to about 100 nm, preferably being 30 nm. The dielectric sidewall spacers 12 may comprise silicon carbide (SiC), silicon nitride ($Si_3N_4$), or silicon dioxide (SiO). A metal liner 29 may also be utilized to increase adhesion between the metal within the via interconnect 24 and the first metal lines 26. The metal liner 29 may also function as a diffusion barrier. With the application of rigid dielectric sidewall spacers 12 as mechanical support to the thin low-k dielectric layers, thick metal support liners are no longer necessary. Therefore, metal liners having a thickness of less than 50 nm, preferably less than 10 nm, are adequate. The method of forming the interconnect structure 10 depicted in FIG. 2 is now described in greater detail referring to FIGS. 3–12.

Figure 3:
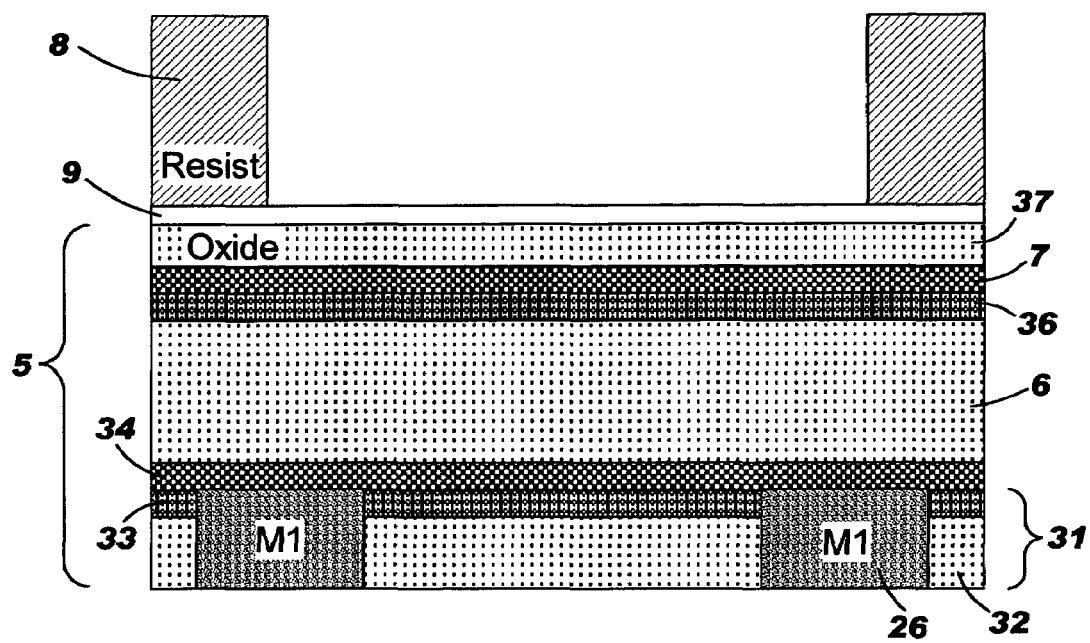
FIGS. 3–12 depict (through cross section) the processing steps for producing the interconnect structure depicted in FIG. 2.

Referring to FIG. 3, an initial structure 5 is provided comprising a lower wiring level 31 including first metal lines 26, lower low-k dielectric 32, a lower rigid insulating layer 33, a lower etch stop layer 34, an upper low-k dielectric layer 6, an upper rigid dielectric layer 36, upper etch stop layer 7, and a dielectric cap layer 37.

The lower low-k dielectric 32 may comprise conventional dielectric materials formed using suitable deposition processes including, but not limited to: CVD, PECVD, PVD, high density plasma CVD or spin on glass process. Preferably, the lower low-k dielectric 32 comprises a low-k dielectric having a thickness ranging from about 10 nm to about 1000 nm, preferably being 300 nm. The dielectric constant of the lower low-k dielectric 32 may be less than about 3.5, preferably ranging from about 1.0 to about 3.0.

Low-k dielectrics may include organic dielectrics such as low dielectric constant polymer dielectrics or may include low dielectric constant carbon-doped oxides. One example of a low-k dielectric polymer dielectric is SiLK™ (trademark of The Dow Chemical Company). Specifically, SiLK™ is a class of polymer-based low-k dielectric materials comprising a b-staged polymer having a composition including about 95% carbon. An example of a low dielectric constant carbon doped oxide is SiCOH.

A rigid dielectric layer 33 may be incorporated to strengthen the underlying low-k dielectric layer 32. The rigid dielectric layer 33 may be deposited using conventional deposition techniques and may comprise silicon nitride ($Si_3N_4$), silicon carbide (SiC) and silicon dioxide ($SiO_2$), most preferably being silicon carbide (SiC). The rigid dielectric layer 33 may have a thickness ranging from about 5 nm to about 100 nm, preferably being 30 nm.

The lower etch stop layer 34 may be deposited by conventional chemical vapor deposition processes atop the first metal lines 26, rigid dielectric layer 33, and lower low-k dielectric 32. The lower etch stop layer 34 may comprise Si nitrides, oxynitrides, or carbide materials, i.e., silicon nitride ($Si_xN_y$), silicon oxynitride ($SiO_xN_y$), or silicon carbide ($SiC_xO_yN_z$), having a thickness ranging from about 10 nm to about 100 nm, preferably being about 50 nm.

An upper low-k dielectric layer 6 may be deposited on the lower etch stop layer 34 using conventional processes such as chemical vapor deposition (CVD), plasma enhanced chemical vapor deposition (PECVD), physical vapor deposition (PVD), high density plasma CVD (HDPCVD) or spin-on processes. In one embodiment, the upper low-k dielectric 32 comprises a thickness ranging from about 10 nm to about 1000 nm, preferably being 300 nm. The upper low-k dielectric layer 6 and the lower low-k dielectric 32 may or may not comprise the same material. The upper low-k dielectric layer 6 preferably comprises SiLK™ as described above. Additionally, upper low-k dielectric layer 6 may have a dielectric constant of less than about 3.5, preferably ranging from about 1.0 to about 3.0.

Still referring to FIG. 3, an upper rigid dielectric layer 36 may be positioned on the upper low-k dielectric layer 6. The upper rigid dielectric layer 36 comprises a mechanically rigid dielectric material including, but not limited to: silicon carbide (SiC), silicon nitride ($Si_3N_4$), or silicon dioxide ($SiO_2$). The upper rigid dielectric layer 36 may have a thickness ranging from about 10 nm to about 100 nm, preferably being 30 nm. The upper rigid dielectric layer 36 and the lower rigid dielectric layer 33 may or may not comprise the same material. The upper rigid dielectric layer 36 preferably comprises SiC having a thickness of about 30 nm.

Following the deposition of the upper rigid dielectric layer 36, an upper etch stop layer 7 may be deposited by conventional chemical vapor deposition processes. The upper etch stop layer 7 may comprise nitride or oxynitrides materials, i.e., silicon nitride ($Si_3N_4$) or silicon oxynitride ($SiO_xN_y$), having a thickness ranging from about 10 nm to about 100 nm, preferably being about 50 nm. The upper etch stop 7 most preferably comprises silicon nitride ($Si_3N_4$).

A dielectric cap layer 37 is then deposited atop the upper etch stop layer 7. The dielectric cap layer 37 may be formed using conventional deposition methods, i.e., chemical vapor deposition, or alternatively may be formed using thermal growth processes, i.e., thermal oxidation or nitridation. The dielectric cap layer 37 may be oxide, nitride, or oxynitride materials, preferably being silicon dioxide ($SiO_2$). The dielectric cap layer 37 may have a thickness ranging from about 10 nm to about 200 nm, preferably being 50 nm.

Still referring to FIG. 3, the initial structures 30 is then patterned and etched using conventional photolithography and etching. First, an anti-reflective coating (ARC) 9 may be spin applied to the upper surface of the initial structure 30 and baked. Alternatively, the anti-reflective coating (ARC) 9 may be omitted. A resist 8 patterned to etch the dielectric cap 37 is then produced by applying a layer of photoresist to the surface to be etched; exposing the layer of photoresist to a pattern of radiation; and then developing the pattern into the photoresist utilizing a conventional resist developer. Once the patterning of the photoresist is completed, the sections covered by the photoresist are protected, while the exposed regions are removed using a selective etching process that removes the unprotected regions.

Figure 4:
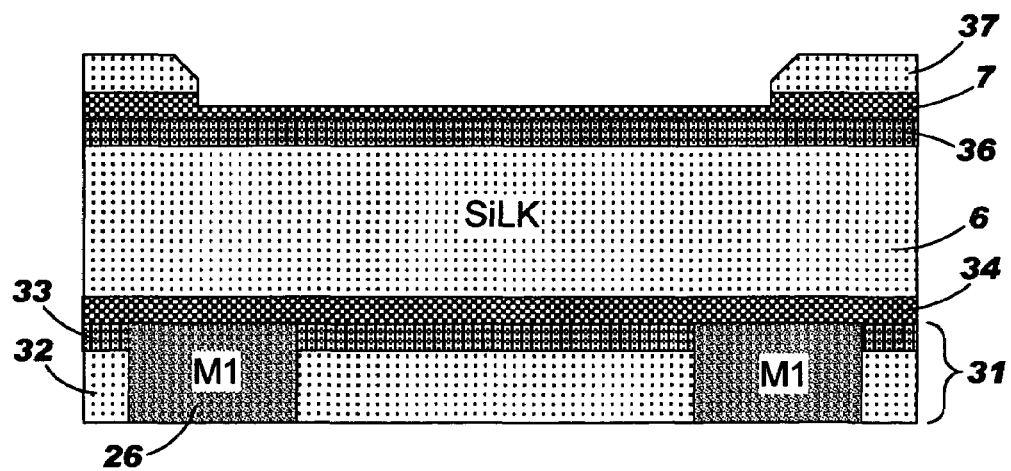

Referring to FIG. 4, following photoresist patterning and development the exposed portions of the antireflective coating 9 and dielectric cap layer 37 are etched using a directional etch process, i.e., reactive ion etch, selective to the upper etch stop layer 7. The resist 8 is then removed using a conventional chemical strip.

Figure 5:
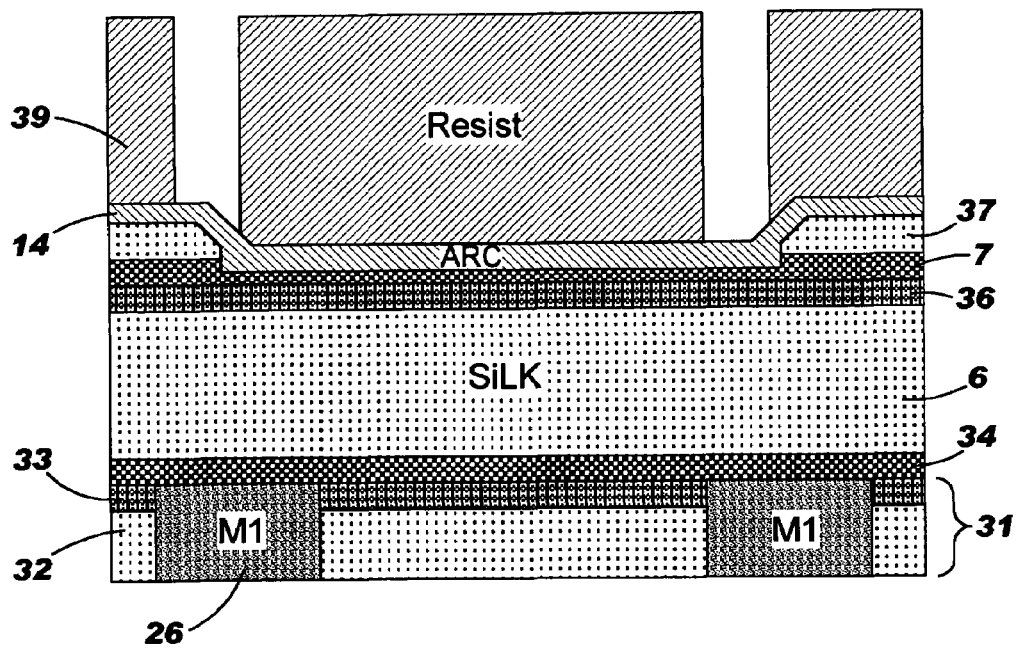

Referring to FIG. 5, following the deposition of an optional second antireflective coating 14, another layer of photoresist is deposited atop the remaining portions of dielectric cap layer 37. A via patterned resist 39 is then formed from the photoresist layer using conventional photolithography and development processes. Portions underlying the via pattern resist are protected during subsequent etch process steps, while the exposed regions are etched to transfer the via pattern into the underlying layers.

Figure 6:
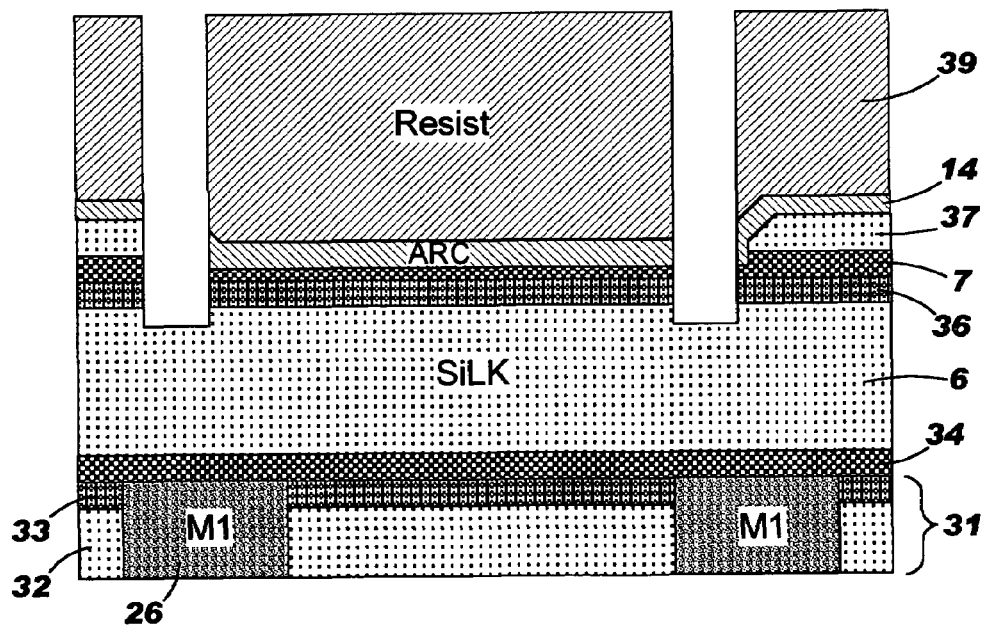

Referring to FIG. 6, the exposed portions of the optional second antireflective layer 14, upper etch stop 7, and upper rigid dielectric layer 36 are then etched selective to the via patterned resist 39 and low-k dielectric layer 6 using a directional etch process, such as reactive ion etch. Preferably, the etch chemistry is selective to removing $Si_3N_4$ of the upper etch stop 7 and SiC of the low-k dielectric layer 6, while not substantially etching the upper low-k dielectric layer 6 comprised of a polymer material or carbon doped oxide. The via pattern resist 39 may then be stripped using a chemical strip process.

Figure 7:
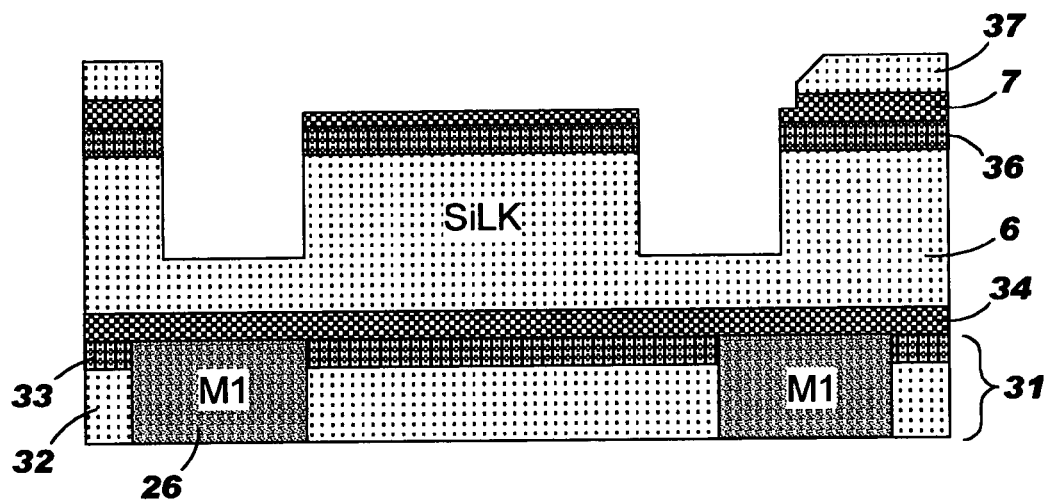

Referring to FIG. 7, the via pattern may be partially extended through the low-k dielectric layer 6 using the remaining portions of the dielectric cap layer 37 and upper etch stop layer 7 as a hard mask during a directional etch process selective to removing the exposed portions of the upper low-k dielectric layer 6. The duration of the low-k dielectric etch process may be determined by end point detection. Preferably, the etch chemistry is selective to removing the polymer material or carbon doped oxide of the low-k dielectric layer 6 without substantially etching the $SiO_2$ of the remaining portions of the dielectric cap 37, and without substantially etching the exposed portion of the $Si_3N_4$ upper etch stop layer 34. In a preferred embodiment, following the low-k dielectric etch process, a portion of low-k dielectric material 6 remains atop the lower etch stop 34, as depicted in FIG. 7.

Figure 8:
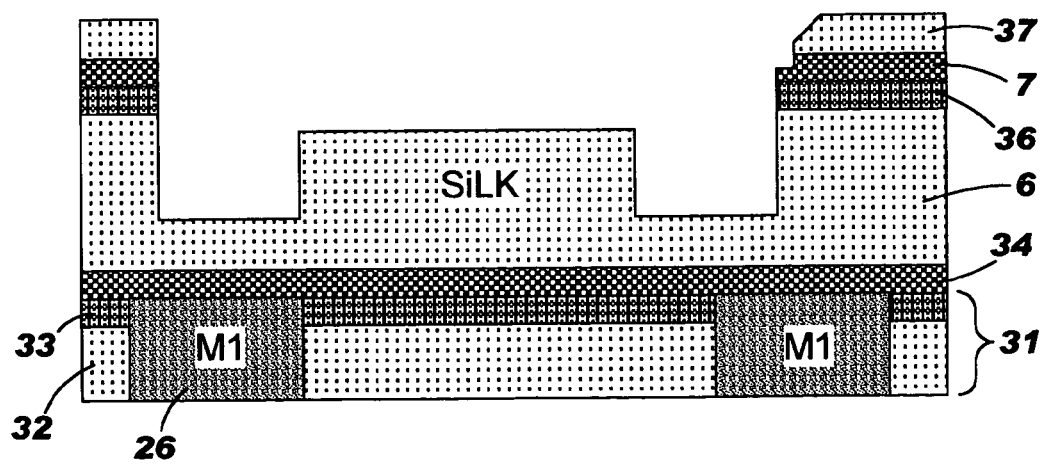

Referring now to FIG. 8, in a next process step the exposed portions of the etch stop layer 7 and upper rigid dielectric layer 36 are removed by a direction etch process, i.e., reactive ion etch, selective to the low-k dielectric layer 6 and the remaining portions of the cap dielectric layer 37, where the remaining portion of the cap dielectric layer 37 functions as a hard mask. Preferably, the etch chemistry removes an exposed portion of a $Si_3N_4$ upper etch stop 7 and etches an exposed portion a SiC upper rigid dielectric layer 36 selectively to the remaining portions of the $SiO_2$ cap dielectric layer 37 and polymeric material or carbon doped oxide of the upper low-k dielectric layer 6.

Figure 9:
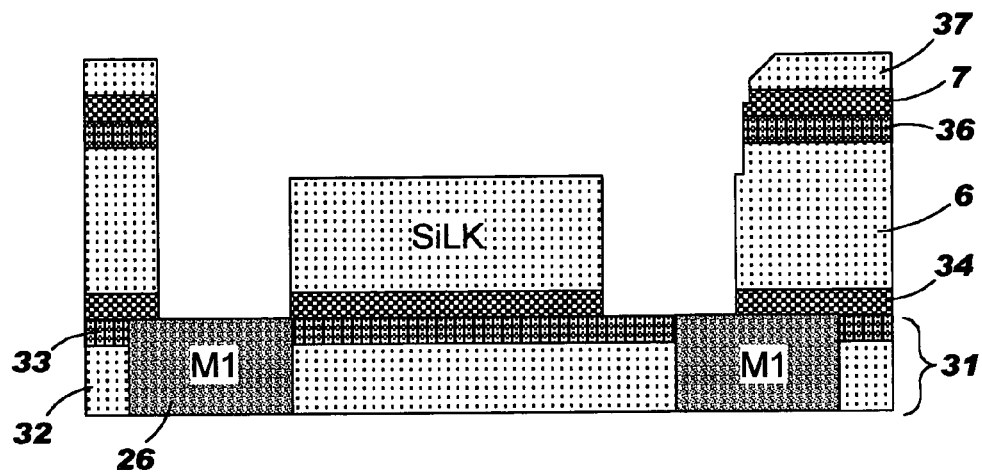

Turning now to FIG. 9, the top surfaces of the first metal lines 26 are now exposed during a directional etch that recesses the upper low-k dielectric 6 and removes the lower etch stop 34 from the top surface of the first metal lines 26. First, a directional etch comprising a first etch chemistry may be utilized to selectively remove upper low-k dielectric material 6 and expose the underlying lower etch stop 34. Thereafter, another directional etch comprising a second etch chemistry selectively removes the exposed portions of the lower etch stop 34 without substantially etching the first metal lines 26, remaining portions of the dielectric cap 37, and the exposed portions of the upper low-k dielectric layer 6. Alternatively, the top surface of the first metal lines 26 may be exposed during a single etch process that recesses the upper low-k dielectric layer 6 and removes the underlying lower etch stop layer 34, while not substantially etching the remaining portion of the dielectric cap 37.

Figure 10:
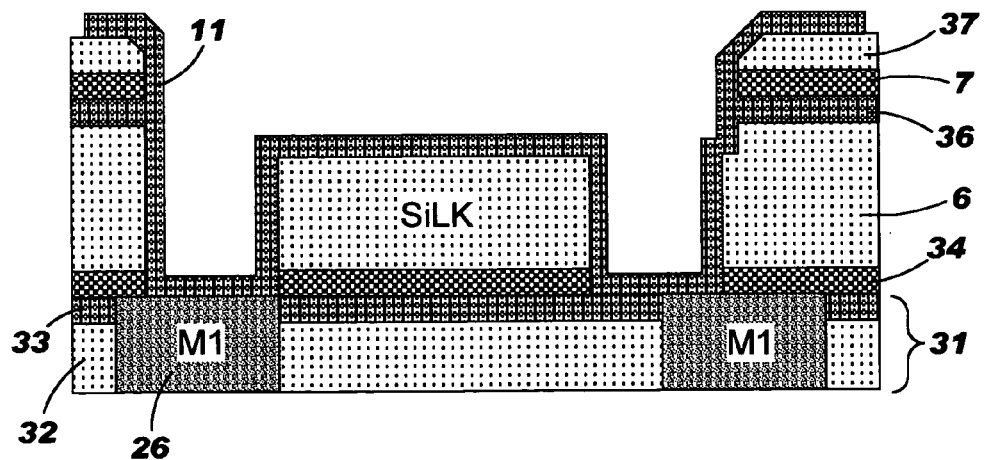

Turning to FIG. 10, a conformal rigid dielectric liner 11 is then deposited using plasma enhanced chemical vapor deposition. Alternatively, the rigid dielectric liner 11 may be deposited using a chemical vapor deposition processes including but not limited to: physical vapor deposition (PVD), plasma enhanced chemical vapor deposition (PECVD), high density plasma chemical vapor deposition (HDPCVD), THCVD, and low pressure chemical vapor deposition (LPCVD). The conformal rigid insulating liner 11 may have a thickness ranging from about 10 nm to about 100 nm, preferably being about 30 nm. The conformal rigid dielectric liner 11 may be uniformly deposited on both the vertical and horizontal surfaces of the structure depicted in FIG. 9. The rigid dielectric liner 11 may be SiC, $SiO_2$, $Si_3N_4$ or combinations thereof.

Figure 11:
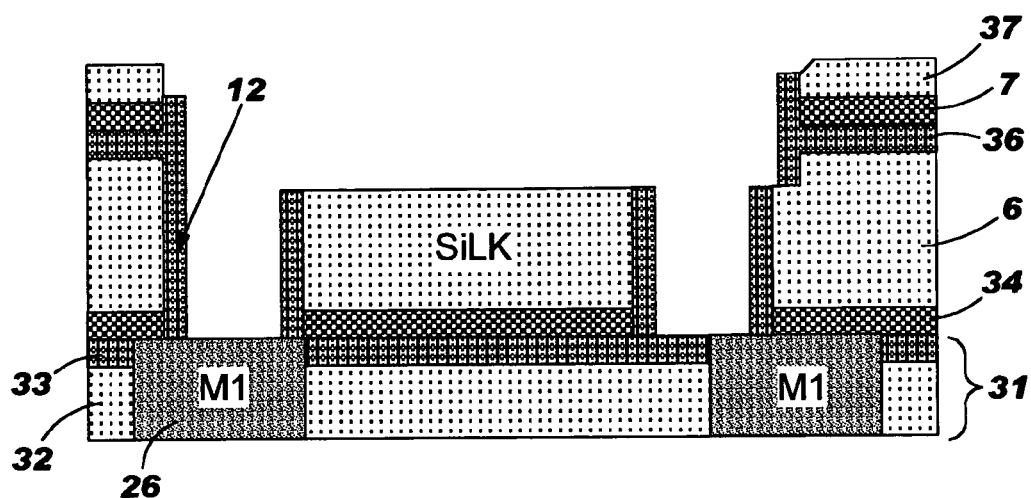

Turning now to FIG. 11, a directional etch process then removes the horizontal surfaces of the conformal rigid dielectric liner 11, where the remaining portion of the conformal rigid dielectric liner 11 positioned on the vertical surfaces of the structure form rigid dielectric sidewall spacers 12 positioned on the via 24 sidewalls of the low-k dielectric layer 6. It is noted that the conformal rigid insulating layer 11 is removed from the horizontal surface of the first metal lines 26 providing an exposed upper surface of the first metal lines 26. The rigid insulating sidewall spacers 12 reinforce the via 24 regions 24 of the mechanically weak low-k dielectric layer 6. It is further noted that the rigid dielectric sidewall spacers 12 protect the upper low-k dielectric layer 6 from damage or erosion during conventional BEOL processing.

In an alternate embodiment, the conformal rigid insulating liner 11 may be deposited within the via 24 and atop the horizontal surface of the lower etch stop 34. In this embodiment, the conformal rigid insulating liner 11 is formed before the lower etch stop layer 34 is etched from the top surface of the first metal lines 26. Following the deposition of the conformal rigid insulating layer 11, a selective etch process is then conducted to remove the horizontal surfaces of the conformal rigid insulating layer 11 forming rigid insulating sidewall spacers 12 and to remove the lower etch stop layer 34 exposing the upper surface of the first metal lines 26.

Figure 12:
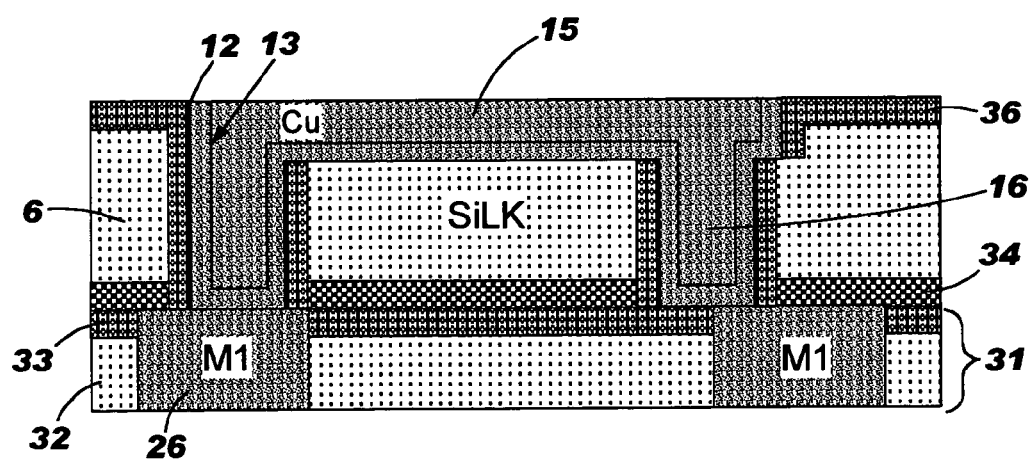

Referring to FIG. 12, following the formation of the rigid insulating sidewall spacers 12, a metal liner 13 is deposited atop the horizontal and vertical surfaces of the structure depicted in FIG. 11 including the exposed upper surface of the first metal lines 26 and the rigid insulating sidewall spacers 12. The metal liner 13 may comprise Ta, TaN, W or WN. The metal liner 12 may have a thickness ranging from about 2 nm to about 50 nm, preferably being 10 nm. The metal liner 12 having the above-disclosed thickness may be deposited by sputter deposition.

In this embodiment, rigidity is provided to the interconnect structure 10 by the rigid insulating sidewall spacers 12. Therefore, it is not necessary that the metal liner 13 provide rigidity to the structure and therefore does not require that a thick metal liner 11 be deposited. The metal liner 13 may increase the adhesion of the first metal wiring layer to subsequently deposited metals. The metal liner 13 may also function as a diffusion barrier between the lower metal wiring 26 and later deposited materials.

Following metal liner 13 formation, a second metal lines 25 and metal vias 16 are formed by depositing a metal. The metal may be copper, aluminum, silver, gold and alloys thereof, preferably being copper. The metal may be deposited by sputter deposition or by electroplating. Preferably, copper is deposited in a two-step process beginning with forming a copper seed layer (not shown) by sputter deposition and then electroplating copper atop the copper seed layer. Following metal deposition, the deposited metal is then planarized back and polished using chemical mechanical polishing techniques or similar planarization methods. The structure is planarized to the upper rigid layer 36, therefore removing the remaining portions of the cap dielectric layer 37 and the upper etch stop layer 7.

Figure 13:
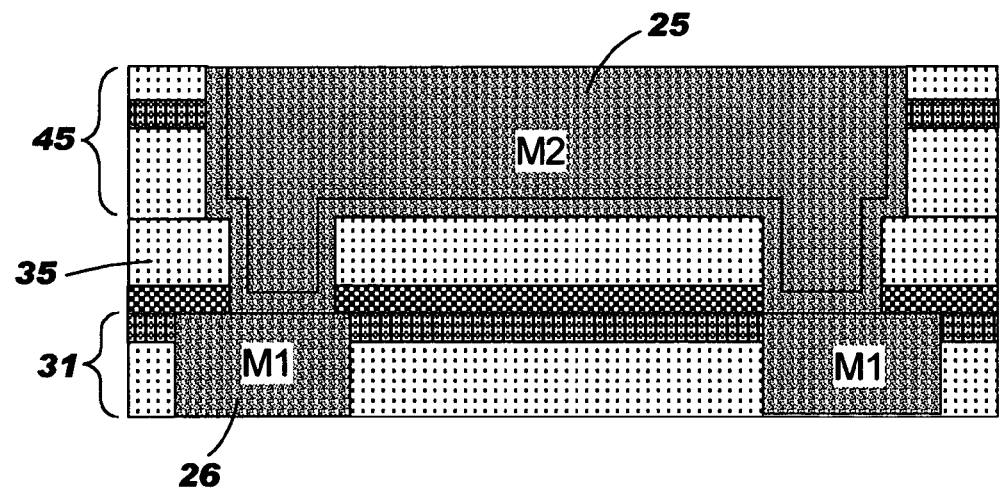
FIG. 13 depicts (through cross section) another embodiment of the present invention including a mechanically rigid dielectric which strengthens the via region of an interconnect structure including low-k dielectric layers.

In another embodiment of the present invention, a mechanically rigid dielectric layer 35 is positioned between a lower metal wiring level 31 and an upper metal wiring level 45, where electrical communication between the first and second metal wiring levels is provided by interconnect vias extending through the mechanically rigid dielectric layer 35, as depicted in FIG. 13.

Referring to FIG. 13, the mechanically rigid dielectric 35 surrounding the via 24 may be a dielectric material having a higher mechanical strength than low-k dielectric layers 23, 32. Additionally, the dielectric utilized in the mechanically rigid dielectric layer 35 may have a coefficient of thermal expansion that is matched to the coefficient of thermal expansion of the metal utilized in the via 24. Preferably, the mechanically rigid dielectric layer 35 may comprise oxides, such as $SiO_2$; doped silicate glass, such as fluorinated silicate glass; or carbon doped oxides, such as SiCOH, where the coefficient of thermal expansion is matched with the interconnect metal, i.e., copper.

Although the mechanically rigid dielectric layer 35 may provide greater rigidity to the interconnect structure than the first embodiment, depicted in FIGS. 2–12, the mechanically rigid dielectric 35 has a higher dielectric constant than dielectric layers comprising of low-k polymers or low-k carbon doped oxides. Therefore, the mechanically rigid 35 may increase the interconnect capacitance of the device when compared with the embodiment depicted in FIGS. 2–12. The method of forming the interconnect structure 10 depicted in FIG. 13 is now described in greater detail referring to FIGS. 14–23.

Figure 14:
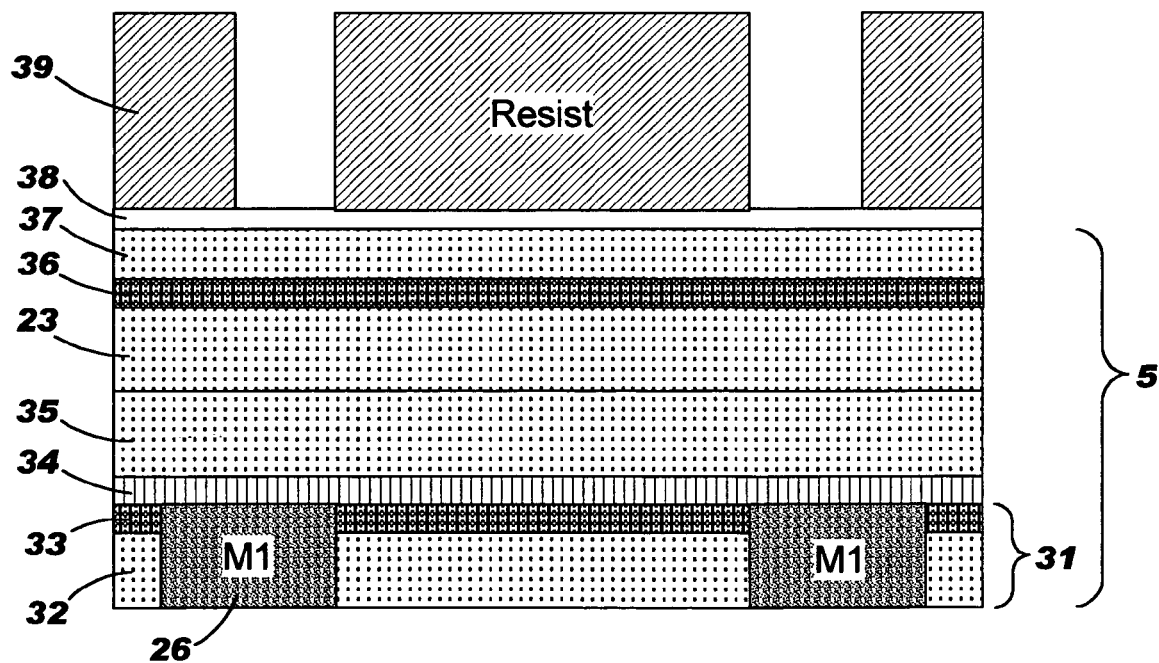
FIGS. 14–23 depict (through cross section) the processing steps for producing the interconnect structure depicted in FIG. 13.

Referring to FIG. 14, an initial structure 30 is provided comprising a lower wiring level 31 including first metal lines 26, lower low-k dielectric 32, and lower rigid insulating layer 33, lower etch stop layer 34, mechanically rigid dielectric 35; upper low-k dielectric 23; upper rigid insulating layer 36; and cap dielectric layer 37.

The lower low-k dielectric 32 may be formed using suitable processes such as CVD, PECVD, PVD, high density plasma CVD or spin-on glass process. The lower low-k dielectric 32 comprises a low-k dielectric having a thickness ranging from about 10 nm to about 1000 nm, preferably being 300 nm. Preferably the lower low-k dielectric 32 has a dielectric constant of less than about 3.5, preferably ranging from 1.0 to 3.0.

Low-k dielectrics may include organic dielectrics such as low dielectric constant polymer dielectrics or may include low dielectric constant carbon-doped oxides. One example of a low-k dielectric polymer dielectric is SiLK™ (trademark of The Dow Chemical Company). Specifically, SiLK™ is a class of polymer-based low-k dielectric materials comprising a b-staged polymer having a composition including about 95% carbon. An example of a low dielectric constant carbon doped oxide is SiCOH.

A rigid dielectric layer 33 may be incorporated to strengthen the underlying low-k dielectric layer 32. The rigid dielectric layer 33 may be deposited using conventional deposition techniques and may comprise silicon nitride ($Si_3N_4$), silicon carbide (SiC) and silicon dioxide ($SiO_2$), most preferably being silicon carbide (SiC). The rigid dielectric layer may have a thickness ranging from about 10 nm to about 100 nm, preferably being 30 nm.

The first metal lines 26 may be formed within the lower low-k dielectric 32 by conventional methods, including but not limited to: photoresist application, photolithography patterning; pattern development; selectively etching lower rigid dielectric layer 33 and lower low-k dielectric 32; pattern strip; metal sputter deposition; and planarization. First metal lines 26 may comprise conventional wiring metals including, but not limited to: aluminum (Al), copper (Cu), tungsten (W), gold (Au) and silver (Ag) and alloys thereof. The first metal lines preferably comprise copper.

The lower etch stop layer 34 may be deposited by conventional chemical vapor deposition processes atop the first metal lines 26, rigid dielectric layer 33, and lower low-k dielectric 32. The lower etch stop layer 34 may comprise nitride or oxynitrides materials, i.e., silicon nitride ($Si_3N_4$) or silicon oxynitride ($SiO_xN_y$), having a thickness ranging from about 10 nm to about 100 nm, preferably being about 50 nm. The lower etch stop layer preferably comprises $Si_3N_4$.

The mechanically rigid dielectric 35 may be applied atop the lower etch stop layer 34 using conventional chemical vapor deposition processes, where the mechanically rigid dielectric 35 has a thickness ranging from about 100 nm to about 1,000 nm, preferably being 300 nm. Preferably, the mechanically rigid dielectric layer 35 may comprise oxides, such as $SiO_2$; doped silicate glass, such as fluorinated silicate glass; or carbon doped oxides, such as SiCOH. Alternatively, the mechanically rigid dielectric 35 may be other dielectric materials including nitrides, oxynitrides, and other low-k dielectrics. The mechanically rigid dielectric 35 may also have a coefficient of thermal expansion that is matched to the interconnect metal. The coefficient of thermal expansion of the mechanically rigid dielectric 35 may range from about 0.1 ppm/° C. to about 5 ppm/° C., preferably being 1 ppm/° C. The dielectric constant of the mechanically rigid dielectric 35 may range from 2.5 to about 4.2, preferably being 3.2.

An upper low-k dielectric layer 23 can be deposited on the mechanically rigid dielectric 35 using conventional processes such as CVD, PECVD, PVD, high density plasma CVD or spin-on processes. In one embodiment, the lower low-k dielectric 23 comprises a low-k dielectric having a thickness ranging from about 10 nm to about 1000 nm, preferably being 300 nm. The upper low-k dielectric layer 23 and the lower low-k dielectric 32 may or may not comprise the same material. The upper low-k dielectric layer 23 preferably comprises SiLK™ as described above. The upper low-k dielectric layer 23 has a dielectric constant of less than about 3.5, preferably ranging from about 1.0 to about 3.0.

Still referring to FIG. 14, an upper rigid dielectric layer 36 may be positioned on the upper low-k dielectric layer 23. The upper rigid dielectric layer 36 comprises a mechanically rigid insulating layer including, but not limited to: silicon carbide (SiC), silicon nitride ($Si_3N_4$), or silicon dioxide ($SiO_2$). The upper rigid dielectric layer 36 may have a thickness ranging from about 10 nm to about 100 nm, preferably being 30 nm. The upper rigid dielectric layer 36 and the lower rigid dielectric layer 33 may or may not comprise the same material. The upper rigid dielectric layer 36 preferably comprises silicon carbide (SiC) having a thickness of about 30 nm.

A dielectric cap layer 37 is then deposited atop the upper rigid dielectric layer 36. The dielectric cap layer 37 can be formed using conventional deposition methods, i.e., chemical vapor deposition, or alternatively may be formed using thermal growth processes, i.e., thermal oxidation or nitridation. The dielectric cap layer 37 may be oxide, nitride, or oxynitride materials, preferably being silicon dioxide ($SiO_2$). The dielectric cap layer 37 may have a thickness ranging from about 10 nm to about 200 nm, preferably being 50 nm.

Referring to FIG. 14, the initial structure 30 is then patterned and etched using conventional photolithography and etch processes. First, an anti-reflective coating (ARC) 38 is formed on the upper surface of the initial structure 30. Alternatively, the anti-reflective coating (ARC) 38 may be omitted. A via patterned resist 39 is then produced by applying a photoresist to the surface to be etched; exposing the photoresist to a pattern of radiation; and then developing the pattern utilizing conventional resist developer. Once the patterning of the photoresist is completed, the sections covered by the photoresist are protected while the exposed regions are removed using a selective etching process that removes the unprotected regions.

Figure 15:
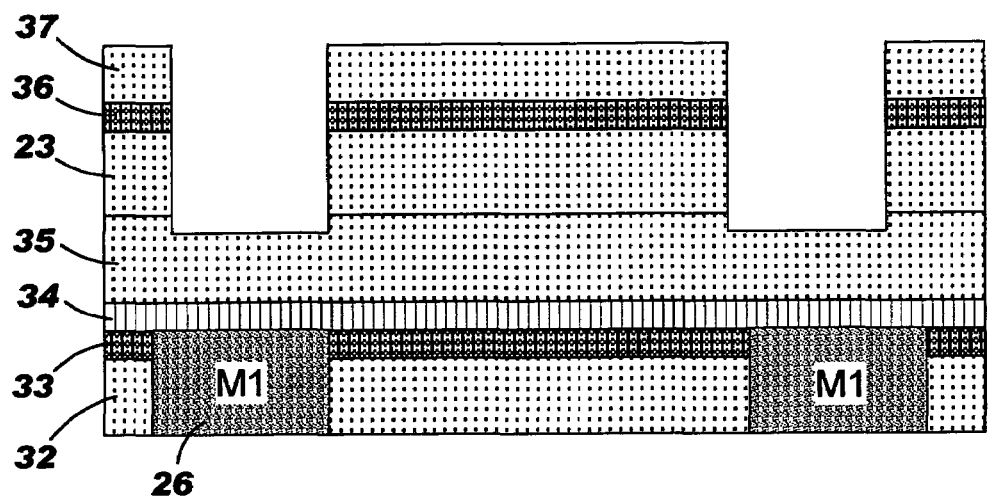

Referring to FIG. 15, following resist patterning and development the exposed portions of the underlying dielectric cap layer 37, upper rigid dielectric layer 36, and upper low-k dielectric 23 are etched using a directional etch process, i.e., reactive ion etch, selective to the mechanically rigid dielectric 35. The etch process may include fluorinated etch chemistries that are known to those skilled in the art. The via patterned resist 39 is then removed using a conventional chemical strip.

Figure 16:
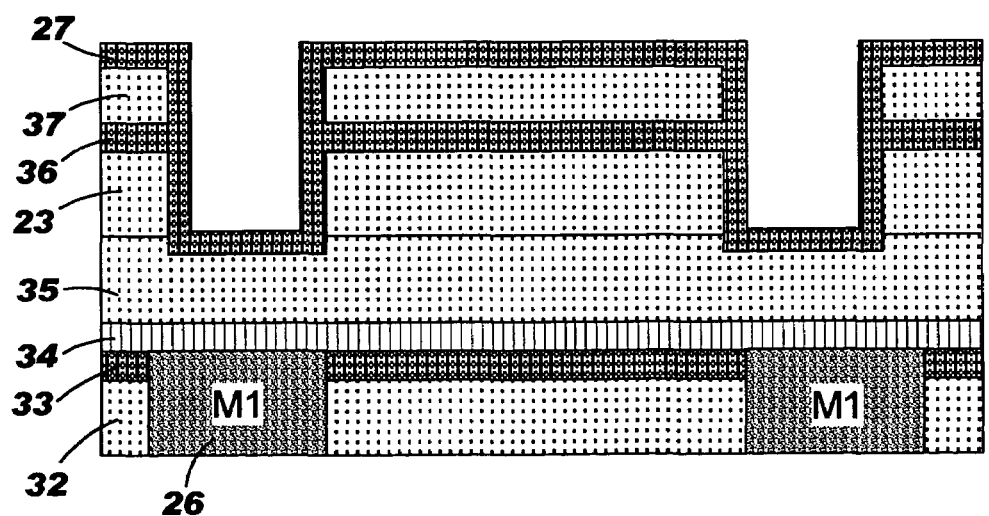

Referring to FIG. 16, in a next process step a conformal rigid liner 27 is deposited using chemical vapor deposition processes including, but not limited to: physical vapor deposition (PVD), plasma enhanced chemical vapor deposition (PECVD), high density plasma chemical vapor deposition (HDPCVD), and low pressure chemical vapor deposition (LPCVD). The conformal rigid liner 27 may be any rigid insulating material including, but not limited to: silicon carbide, silicon nitride, silicon dioxide. The conformal rigid liner 27 may have a thickness ranging form about 10 nm to about 100 nm, preferably being 30 nm. Most preferably, the conformal rigid liner 27 is silicon carbide having a thickness on the order of 30 nm.

Figure 17:
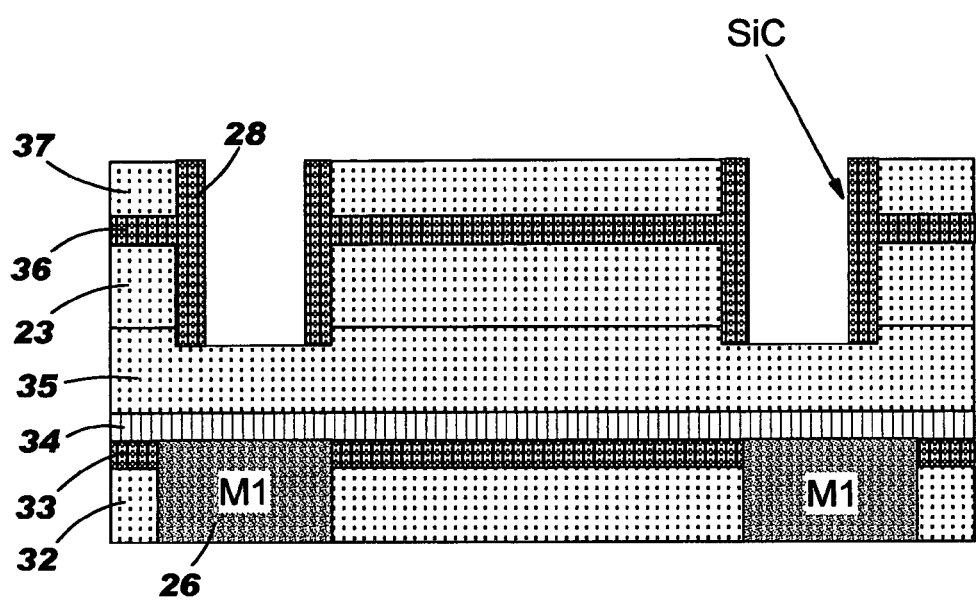

Referring to FIG. 17, a selective directional etch, i.e., reactive ion etch, then removes the horizontal surfaces of the conformal rigid liner 27, where the conformal rigid liner 27 remains along the sidewalls of the dielectric cap 37, upper rigid dielectric layer 36, and upper low-k dielectric 23; forming sacrificial rigid sidewall spacers 28. The direction etch process is selective to the mechanically rigid dielectric 35. End point detection may be employed to ensure that the integrity of the mechanically rigid dielectric 35 is not compromised during the conformal liner 27 etch. Alternatively, the etch process may be timed.

Figure 18:
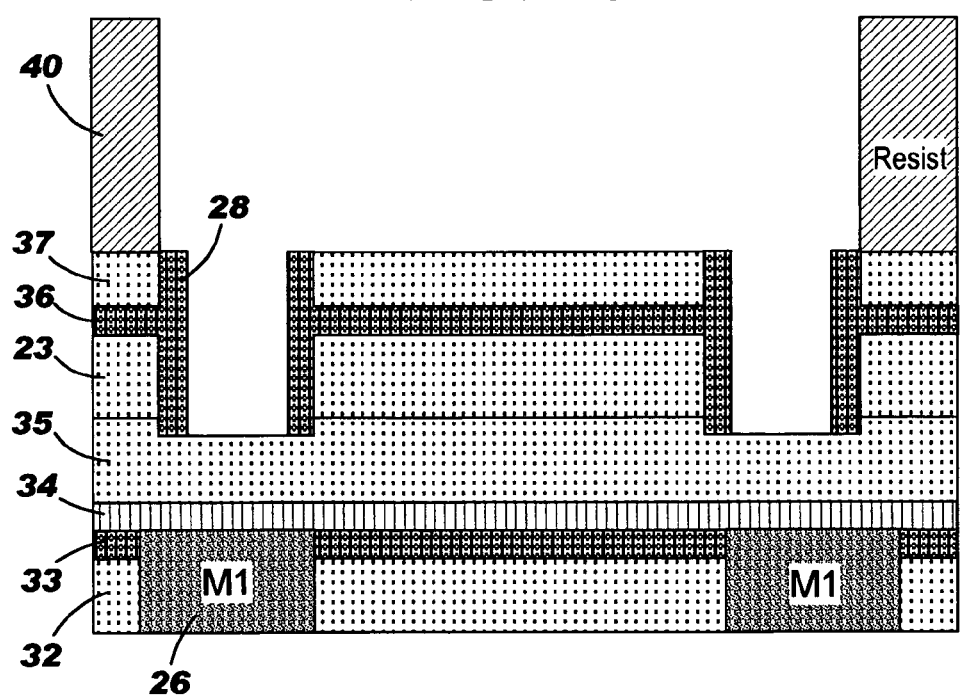

Referring to FIG. 18, a metal line patterned resist 40 is then formed from a layer of photoresist, which is thereafter patterned using conventional photolithography and development processes, as described above. In one embodiment, the metal line patterned resist 40 exposes an underlying portion wider than the portion of the initial structure 5 exposed by the via patterned resist 39.

Figure 19:
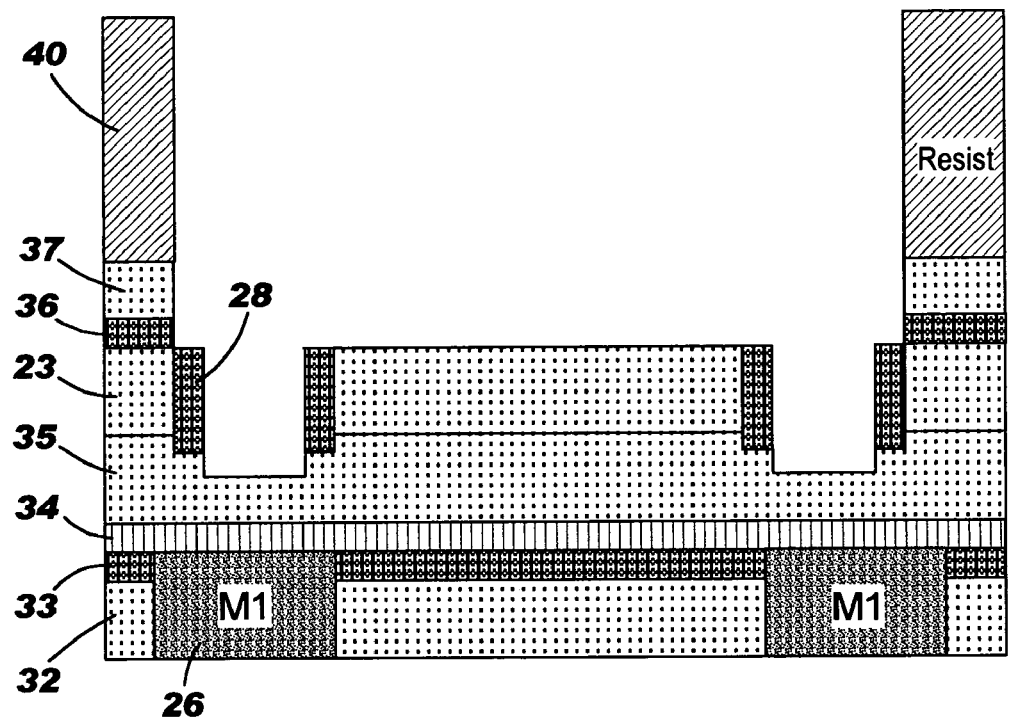

Referring to FIG. 19, using the metal line patterned resist 40 as an etch mask another direction etch process, i.e., reactive ion etch, is then conducted removing the exposed portions of dielectric cap layer 37, horizontal surfaces of the conformal rigid liner 27, and the upper rigid dielectric 36 selective to the upper low-k dielectric 23. Preferably, the exposed portions of the structure not protected by the overlying metal line patterned resist 40 are removed by an etch chemistry that is selective to removing $SiO_2$, of the dielectric cap layer 37; SiC of upper rigid dielectric layer 36; and SiC of the conformal rigid liner 27; without etching the polymer material of the upper low-k dielectric 23, preferably being SiLK™. The vertical height of the sacrificial rigid sidewall spacers 28 may be recessed by the directional etch. The etch chemistry may comprise fluorinated species. In order to ensure that the mechanically rigid dielectric 35 is not overetched the selective etch process may be timed or an end-point detection may be utilized to monitor the etch process.

Figure 20:
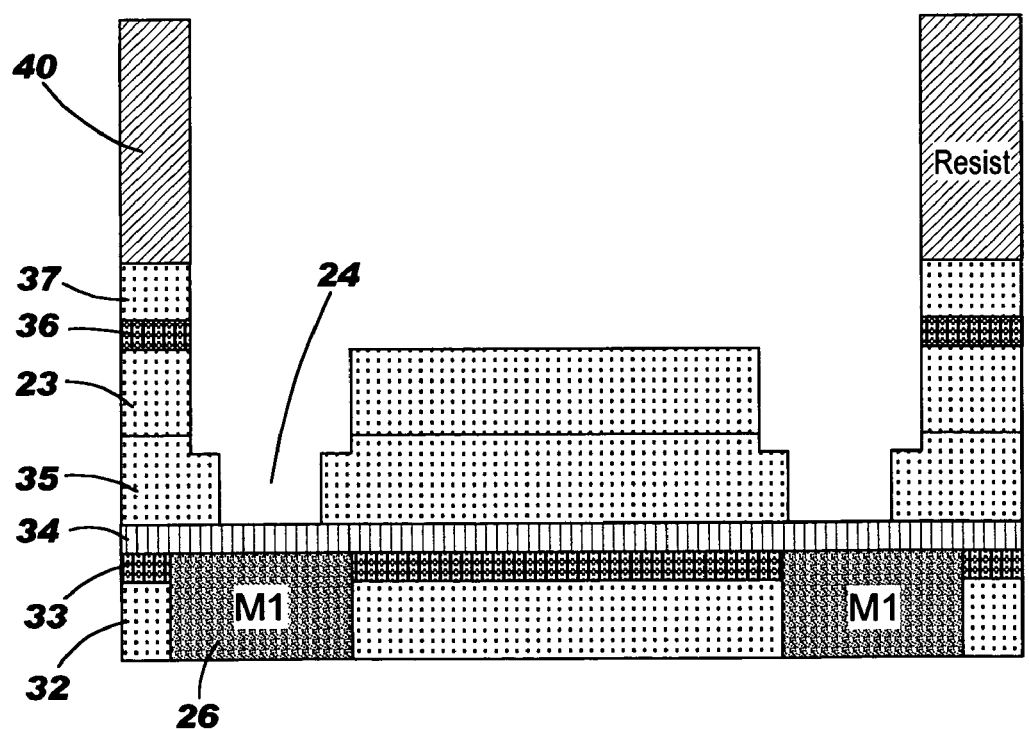

Referring to FIG. 20, utilizing the same metal line patterned resist 40, a directional etch, i.e., reactive ion etch, selective to the mechanically rigid dielectric 35 produces a via 24 terminating on the etch stop layer 34. It is noted that during this etch step the pattern originally produced by the via pattern resist 39 is extended through the mechanically rigid dielectric 35. In one embodiment, the directional etch selectively removes oxide material, i.e., $SiO_2$, from the mechanically rigid dielectric 35 that is not protected by the overlying metal line patterned resist 40. Preferably, the etch chemistry may be selective to the $Si_3N_4$ etch stop layer 33. An additional etch may be conducted following the oxide etch to remove the rigid sacrificial sidewall spacers 28.

Figure 21:
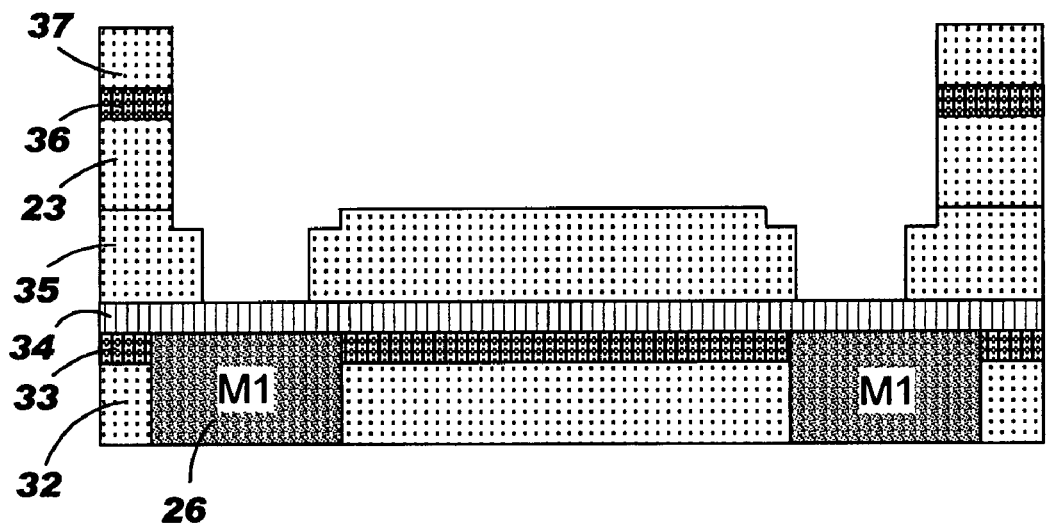

Referring to FIG. 21, an upper low-k dielectric 23 etch is then conducted using a direction etch having an etch chemistry selective to the mechanically rigid dielectric 35 and etch stop layer 33. Preferably, the etch chemistry removes the polymer of the low-k dielectric layer 23, i.e., SiLK™, without substantially etching the $SiO_2$ of the mechanically rigid dielectric 35 and the $Si_3N_4$ etch stop layer 33. The metal line patterned resist 40 is stripped during the low-k dielectric etch.

Figure 22:
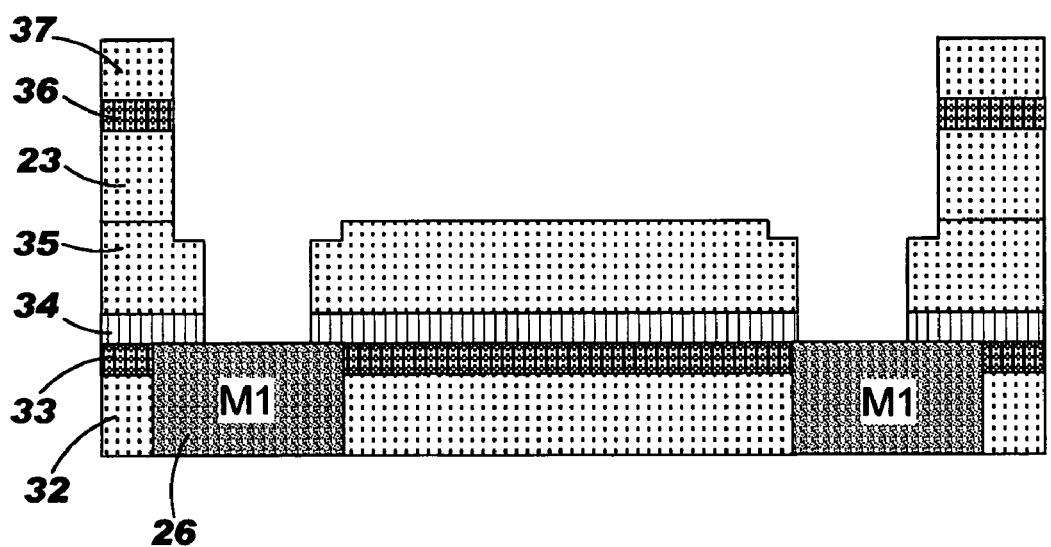

Referring to FIG. 22, the exposed portion of the lower etch stop barrier 33 is then removed using a directional etch, that may be timed to ensure that the integrity of the underlying first metal lines 26 is not compromised during the etch stop barrier 33 etch. Preferably, the etch stop barrier etch comprises an etch chemistry that is selective to the dielectric cap 37 material, i.e. $SiO_2$, and the first metal lines 26. End point detection methods may also be employed to ensure that the underlying metal lines 26 are not etched. At the conclusion of the etch stop barrier 33 etch the upper surface of the first metal lines 26 is exposed.

Figure 23:
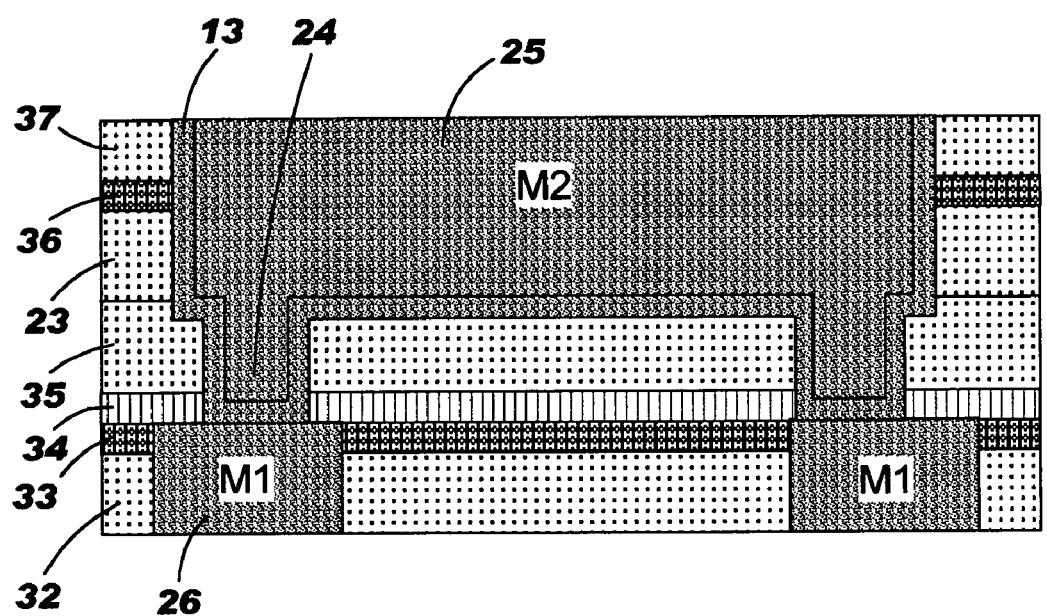

Turning now to FIG. 23, a metal liner 13 is then deposited on the top surface of the structure depicted in FIG. 22, including the exposed top surface of the lower metal wiring 26. The metal liner 13 may be thin layer of Ta, TaN, W, TiN, or WN having a thickness ranging from 2 nm to about 50 nm, with about 5 nm being preferred. The metal liner 13 may be deposited using conventional deposition processes well known within the skill of the art, including but not limited to sputter deposition, atomic layer deposition, and chemical vapor deposition. In this embodiment, rigidity is provided to the interconnect structure 10 by the mechanically rigid dielectric 35. Therefore, it is not required that the metal liner 13 provide rigidity to the structure and therefore does not require that a thick metal liner 11 be deposited. The metal liner 13 may increase the adhesion of subsequently deposited metals to the underlying first metal wiring 26 and/or act as a barrier layer.

In a next process step, a high conductivity metal is deposited atop the metal liner 12. The high conductivity metal may comprise cupper (Cu), silver (Ag), gold (Ag), aluminum (Al) and alloys thereof. The high conductivity metal may be deposited by conventional metal deposition processes well known within the skill of the art, including but not limited to: plating, chemical vapor deposition, and sputter deposition. Preferably, copper is deposited in a two-step process beginning with forming a copper seed layer (not shown) by sputter deposition and then electroplating copper atop the copper seed layer. Following metal deposition the deposited metal is then planarized back and polished using chemical mechanical polishing techniques or similar planarization methods. The resultant structure is second metal lines 25, as depicted in FIG. 23.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

The invention claimed is:

1. A method of forming an interconnect structure comprising the steps of:
   providing a lower metal wiring layer having first metal lines located within a lower low-k dielectric;
   depositing an upper low-k dielectric atop said lower metal wiring layer;
   etching at least one portion of said upper low-k dielectric to provide at least one via to said first metal lines;
   forming rigid dielectric sidewall spacers in said at least one via of said upper low-k dielectric, said dielectric sidewall spacers are of a material selected from the group consisting of SiCH, SiCOH, and $SiO_2$; and
   forming second metal lines in said at least one portion of said upper low-k dielectric.

2. The method of claim 1 wherein said upper low-k dielectric and said lower low-k dielectric comprise materials having a dielectric constant ranging from about 1.0 to about 3.5.

3. The method of claim 1 wherein said upper low-k dielectric and said lower low-k dielectric comprise low-k polymers or low-k carbon doped oxides.

4. The method of claim 1 wherein said forming rigid dielectric sidewall spacers further comprises:
   depositing a conformal rigid dielectric liner atop said upper low-k dielectric and within said at least one via; and
   etching horizontal surfaces of said conformal rigid dielectric liner to form said rigid dielectric spacers positioned on vertical sidewalls of said at least one via.

5. The method of claim 4 wherein depositing a conformal rigid dielectric liner further comprises physical vapor deposition (PVD), plasma enhanced chemical vapor deposition (PECVD), high density plasma chemical vapor deposition (HDPCVD), or low pressure chemical vapor deposition (LPCVD).

6. The method of claim 5 wherein said conformal rigid dielectric liner has a thickness ranging from about 10 nm to about 100 nm.

7. The method of claim 6 wherein said etching horizontal surfaces of said conformal rigid dielectric liner further comprises an anisotropic etch process.

8. The method of claim 7 wherein said lower metal wiring layer further comprises a rigid insulating layer deposited atop said lower low-k dielectric, said rigid insulating layer material selected from the group consisting of SiC, $SiO_2$, and $Si_3N_4$.

* * * * *